(12) United States Patent
Wang et al.

(10) Patent No.: US 7,261,841 B2
(45) Date of Patent: Aug. 28, 2007

(54) THICK FILM CONDUCTOR CASE COMPOSITIONS FOR LTCC TAPE

(75) Inventors: Yueli Wang, Morrisville, NC (US); Christopher R. Needes, Chapel Hill, NC (US); Patricia J. Ollivier, Raleigh, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 24 days.

(21) Appl. No.: 10/967,986

(22) Filed: Oct. 19, 2004

(65) Prior Publication Data

US 2005/0106369 A1 May 19, 2005

Related U.S. Application Data

(60) Provisional application No. 60/523,371, filed on Nov. 19, 2003.

(51) Int. Cl.
*H01B 1/02* (2006.01)
*B32B 3/00* (2006.01)
*H05I 1/09* (2006.01)

(52) U.S. Cl. ............... 252/514; 252/519.12; 428/209; 428/210; 174/257

(58) Field of Classification Search ............ 428/210, 428/209; 252/514, 519; 174/257
See application file for complete search history.

(56) References Cited

U.S. PATENT DOCUMENTS

| | | | |
|---|---|---|---|
| 3,502,489 A | 3/1970 | Cole | |
| 3,909,327 A * | 9/1975 | Pechini | 156/89.14 |
| 4,416,932 A | 11/1983 | Nair | |
| 4,463,059 A | 7/1984 | Bhattacharya et al. | |
| 4,636,332 A * | 1/1987 | Craig et al. | 252/514 |
| 4,654,095 A | 3/1987 | Steinberg | |
| 4,906,404 A | 3/1990 | Suehiro et al. | |
| 5,202,153 A | 4/1993 | Siuta | |
| 5,254,191 A | 10/1993 | Mikeska et al. | |
| 5,431,718 A | 7/1995 | Lombard et al. | |
| 5,456,778 A * | 10/1995 | Fukuta et al. | 156/89.17 |
| 5,503,286 A | 4/1996 | Nye et al. | |
| 5,714,246 A * | 2/1998 | Shaikh et al. | 428/323 |
| 5,928,568 A | 7/1999 | Paszkiet et al. | |
| 5,995,359 A | 11/1999 | Klee et al. | |
| 2002/0179329 A1 | 12/2002 | Fukuoka et al. | |

FOREIGN PATENT DOCUMENTS

WO  WO 03/17255 A1  2/2003

* cited by examiner

*Primary Examiner*—Cathy F. Lam

(57) ABSTRACT

A thick film composition consisting essentially of:
a) electrically conductive powder;
b) an inorganic binder wherein the inorganic binder is selected from $TiO_2$ and any compounds that can generate $TiO_2$ during firing; and
c) an organic medium.

7 Claims, No Drawings

THICK FILM CONDUCTOR CASE COMPOSITIONS FOR LTCC TAPE

FIELD OF THE INVENTION

This invention is related to thick film conductor compositions for use on LTCC (low temperature co-fired ceramic) tape that incorporate various oxide additions to promote adhesion and the thermal stability of solder joints under isothermal and temperature cycling conditions.

BACKGROUND OF THE INVENTION

An interconnect circuit board of an LTCC design is a physical realization of electronic circuits or subsystems made from a number of extremely small circuit elements that are electrically and mechanically interconnected. It is frequently desirable to combine these diverse electronic components in an arrangement so that they can be physically isolated and mounted adjacent to one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways, called vias, through a dielectric layer. Such a multilayer structure allows a circuit to be more compact than traditional $Al_2O_3$ substrates by allowing vertical integration.

LTCC tape has been widely used in the automotive and telecom industry for its multilayer, cofiring and flexible design capabilities. One of the critical elements in the successful use of the materials is that the surface conductors need to have good soldered adhesion under both thermal aging (isothermal storage at 150° C.) and thermal cycling (typically between a low temperature in the range of −55 to −40° C. and a high temperature in the range of 100–150° C.) conditions. Such exposure often will result in the development of stresses in the solder joints used to attach surface mounted components to the substrate. The primary reason for these stresses is a mismatch in thermal expansion of the various different materials that comprise the joint, namely, the ceramic, the conductor metal, the solder metal, the metal that comprises the leads to the surface-mounted device and the material used to make the device. Through careful layout design and skilled application of underfill materials one can distribute the stresses more evenly and prevent a concentration of stresses at any one joint. However, it is not possible to eliminate these stresses completely. One key to sustaining good soldered adhesion during such exposure is the ability of the materials involved to absorb these stresses without undergoing any permanent or irreversible mechanical damage. In other words any improvement in the mechanical properties, i.e., elastic and bulk modulus, of the materials, particularly those of the underlying tape will increase the ability of the overall joint to absorb stress during thermal exposure.

One of the most common failure modes observed in the thermal cycling of solder joints is cracking of the tape at the periphery of the conductor pad. As exposure continues such cracks can propagate through the dielectric and under the pad itself. In some cases the onset of cracking has been observed after less than 10 cycles. This is compared to a typical specification which requires 500 thermal cycles without evidence of ceramic tape cracking or significant loss of adhesion between the conductor and the underlying tape.

U.S. Pat. No. 5,431,718 to Lombard et al. provides a high adhesion strength, co-fireable, solderable silver metallization material for use with low-fire ceramics. The metallization material includes the metal powder as well as an organic vehicle, and adhesion promoting agents. This combination of elements allows a metallization material which can be cofired at relatively low temperatures necessary for firing ceramic substrate materials while providing an adequate base for soldering subsequent circuit components to the ceramic substrate.

U.S. Pat. No. 4,416,932 to Nair discloses a ceramic substrate having a conductive pattern coating wherein the coating comprises an admixture of finely divided particles of a noble metal or alloy, a low melting, low viscosity glass, a spinel-forming metal oxide and an organo-titanate and the process of making same.

Neither of the above inventions meets the specification of 500 cycles without cracking of the dielectric and maintaining adhesion of the conductor to the substrate during thermal exposure. Accordingly, there exists a need for a conductor composition which is able to surpass the thermal cycling capabilities of the prior art. In particular, there is a need for a conductor composition which can exceed 500 thermal cycles without cracking or losing adhesion on the tape substrate. The present invention provides such conductor compositions.

SUMMARY OF THE INVENTION

The invention is directed to a thick film composition comprising: (a) an electrically conductive powder; (b) $TiO_2$ or any compounds that can generate $TiO_2$ during firing; and (c) an organic medium.

The invention is further directed to a method of forming a multilayer circuit comprising: (a) forming a patterned array of vias in a plurality of layers of green tape; (b) filling the vias in the green tape layer(s) of step (a) with a thick film composition; (c) printing at least one patterned thick film functional layer over a surface of each of the via-filled green tape layers of step (b); (d) printing at least one patterned layer of the thick film composition of the present invention over the outermost surface of the green tape layers of step (c); (e) laminating the printed green tape layers of step (d) to form an assemblage comprising a plurality of unfired interconnected functional layers separated by unfired green tape; and (f) cofiring the assemblage of step (e).

DETAILED DESCRIPTION OF INVENTION

The main components of the thick film conductor composition are conductor powders and titanium dioxide dispersed in an organic medium. The components are discussed herein below.

I. Inorganic Components

The inorganic components of the present invention comprise (1) electrically functional powders and (2) inorganic binder comprising titanium oxide, or any compounds that can generate $TiO_2$ during firing. The inorganic binder may further comprise additional inorganic oxide binders.

A. Electrically Functional Powder

Generally, a thick film composition comprises a functional phase that imparts appropriate electrically functional properties to the composition. The functional phase comprises electrically functional powders dispersed in an organic medium that acts as a carrier for the functional phase which forms the composition. The composition is fired to burn out the organic phase, activate the inorganic binder phase and to impart the electrically functional properties. Prior to firing, the printed parts are dried to remove the volatile solvents. "Organics" is a term used to describe the polymer or resin components of a thick film composition, as well as solvents and small amounts of additional organic components such as surfactants.

The electrically functional powders in the present thick film composition are conductive powders and may comprise a single type of metal powder, mixtures of metal powders, alloys, or compounds of several elements. The particle diameter and shape of the metal powder is not particularly important as long as it is appropriate to the application method. Examples of such powders include gold, silver, platinum, palladium, and combinations thereof. The electrically functional powders of the present invention have a typical size of $D_{50}$ less than about 10 microns.

B. Inorganic Binder—Titanium Oxide

The titanium dioxide used in this invention has three possible functions. First, it can act as a binder to provide adhesion of the conductor on the tape. Second, it could adjust the sintering rate of the conductor during firing to minimize the stress on the tape, and the third, the presence of $TiO_2$ at the interface or trace amount of $TiO_2$ diffusion into the tape could enhance the mechanical strength of the tape. The titanium oxide used in this invention could be directly in the form of an oxide or converted from Ti containing compounds under the firing condition, such as elemental Ti, organo titanates, or crystallization products from a frit. The Ti containing compounds can be binary, ternary and higher. $TiO_2$ may be present in the total composition in less than 2.0 wt. %. In one embodiment, the $TiO_2$ is present in the range of about 0.5 to 1.6 wt. % of the total composition. In a further embodiment, the $TiO_2$ is present in the amount of about 1.0 to about 1.6 wt. % of the total composition.

Titanium dioxide was found to be very effective preventing the cracking of the tape during thermal cycling with addition levels in a very wide range. The general trend is that as the $TiO_2$ level increases, thermal aged adhesion will improve. However, solderability suffers when the $TiO_2$ level is too high. The optimized level of the titanium oxide is determined by the extent that it does not cause poor solder wetting while at the same time providing sufficient adhesion under thermal cycle and thermal aging conditions. Titanium dioxide level also affects the density of the fired thick film and electrical conductivity.

C. Optional Inorganic Binder Components

Titanium dioxide, or any compounds that can generate $TiO_2$ during firing, were found to be the major and most effective components in the composition providing the functions of preserving the integrity of the tape and promoting thermal cycled adhesion. However, oxides such as $CO_3O_4$, $PbO$, $Fe_2O_3$, $SnO_2$, $ZrO_2$, $Sb_2O_3$, $MnO_x$, $CuO_x$ as well as other oxides may also aid in adhesion to some degree, when combined with titanium oxide.

D. Organic Medium

The inorganic components are typically mixed with an organic medium by mechanical mixing to form viscous compositions called "pastes", having suitable consistency and rheology for printing. A wide variety of inert liquids can be used as organic medium. The organic medium must be one in which the inorganic components are dispersible with an adequate degree of stability. The Theological properties of the medium must be such that they lend good application properties to the composition, including: stable dispersion of solids, appropriate viscosity and thixotropy for screen printing, acceptable unfired "green" strength, appropriate wettability of the substrate and the paste solids, a good drying rate, and good firing properties. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The ratio of organic medium in the thick film composition to the inorganic components in the dispersion is dependent on the method of applying the paste and the kind of organic medium used, and it can vary. Usually, the dispersion will contain 50–95 wt % of inorganic components and 5–50 wt % of organic medium (vehicle) in order to obtain good coating.

APPLICATION

The conductor composition of the present invention may be used in conjunction with uncured ceramic material, such as Green Tape™, and various other paste components, to form a multilayer electronic circuit. Green Tape™ is typically used as a dielectric or insulating material for multilayer electronic circuits. The uncured ceramic material may by a lead free tape; for example one embodiment is disclosed in Patent Cooperation Treaty International Application Number PCT/US 03/17255, herein incorporated by reference. One embodiment of a lead free tape useful in the present invention is identified as Product number 960 by E. I. du Pont de Nemours and Company. In one embodiment, the lead free green tape comprises a glass composition comprising, in mole %, 2–8% M, wherein M is selected from an oxide of the group of alkali elements and mixtures thereof, 46–66% $SiO_2$, 3–9% $Al_2O_3$, 5–9% $B_2O_3$, 0–8% MgO, 1–6% SrO and 11–22% CaO wherein the molar ratio of SrO/(MgO+CaO) is between 0.06 and 0.45. In a further embodiment, the glass composition above is utilized except that $SiO_2$ is partially replaced by oxides selected from the group of $ZrO_2$, $P_2O_5$, $GeO_2$ and mixtures thereof within the limits, 0–4% $ZrO_2$, 0–2% $P_2O_5$, 0–1.5% $GeO_2$ in mole % of the total composition. In still a further embodiment, the initial glass composition above is utilized 1 wherein SrO, MgO and CaO are partially replaced by CuO with the proviso that CuO is 0–2.5 mole % of the total glass composition.

A sheet of Green Tape™ is blanked with registration holes in each corner to a size somewhat larger than the actual dimensions of the circuit. To connect various layers of the multilayer circuit, via holes are formed in the Green Tape™. This is typically done by mechanical punching, however, any suitable method may be utilized. For example, a sharply focused laser can be used to volatilize and form via holes in the Green Tape™.

The interconnections between layers are formed by filling the vias with a thick film conductive composition. In the case of this invention, a thick film conductive composition different to that disclosed herein is typically utilized. This conductive composition is usually applied by standard screen printing techniques, however, any suitable application technique may be employed. Each layer of circuitry is typically completed by screen printing conductor tracks. Also, resistor inks or high dielectric constant inks can be printed on selected layer(s) to form resistive or capacitive circuit elements. Conductors, resistors, capacitors and any other components are typically formed by conventional screen printing techniques.

The conductor composition of the present invention may be printed on the outermost layers of the circuit, either before or after lamination. The outermost layers of the circuit are used to attach components. Components are typically wire-bonded, glued or soldered to the surface of fired parts. In the case of a soldered component, the conductor composition of the present invention is particularly useful as it may have superior thermal aged and thermal cycle adhesion over prior art compositions.

After each layer of the circuit is completed, the individual layers are collated and laminated. A confined uniaxial or isostatic pressing die is typically used to ensure precise alignment between layers. The assemblies are trimmed to an appropriate size after lamination. Firing is typically carried out in a conveyor belt furnace or in a box furnace with a programmed heating cycle. The tape may be either constrained or free sintered during the firing process. For example, the methods disclosed in U.S. Pat. No. 4,654,095 to Steinberg and U.S. Pat. No. 5,254,191 to Mikeska may be utilized, as well as others known to those skilled in the art.

As used herein, the term "firing" means heating the assembly in an oxidizing atmosphere, such as air to a temperature, and for a time sufficient to volatilize (burn-out) the organic material in the layers of the assemblage and allow reaction and sintering of the inorganic components of both the tape and conductors. "Firing" causes the inorganic components in the layers, to react or sinter, and thus densify the entire assembly, thus forming a fired article. This fired article may be a multilayered circuit used in telecom and automotive applications (such as automotive vehicles).

The term "functional layer" refers to the printed Green Tapee™, which has conductive, resistive, capacitive or dielectric functionality. Thus, as indicated above, a typical Green Tape™ layer may have contain one or more conductive traces, conductive vias, resistors and/or capacitors.

EXAMPLES

The invention will now be described in further detail with practical examples (Examples 1–9) and a comparative example (Example 10). In these examples, the paste component and their percentages are listed in Table 1.

The paste of Examples 1–10 was formed according to the following methodology as detailed by the preparation of Example 1.

The organic mixture was made by dissolving 15 g ethylcellulose in 85 g of an appropriate solvent, such as terpineol.

A mixture of 17–18 g of the above mentioned organic vehicle and 4–5 g solvent was combined with 1.9–2.1 g platinum powder, 1.4 g titanium dioxide, and 74–75 g silver powder. This mixture was thoroughly dispersed using a three-roll mill. The paste was then formulated with the appropriate amounts of the medium or solvent disclosed above to achieve a viscosity of 150–400 PaS at 10 rpm as measured on a Brookfield HBT viscometer.

Test Procedures Used in Examples

Conductor paste was printed on Du Pont 951 or lead free (ref patent) tape, dried at 120° C. for 5–10 minutes and laminated to the required thickness and layer count to make a 0.050 inch fired thick part. The tape was then cut into the appropriate size to make 1×1 inch parts and fired under standard firing condition for Du Pont Green Tape™ (850° C. for 3.5 h).

Soldered Adhesive Strength Test Method

A typical test pattern is printed with a conductor resistivity test pattern and nine 0.080×0.080 inch pads. Fired thickness of the conductor was between 14 to 17 μm. None of the conductor compositions described herein showed observable distortion on the tape.

For all adhesion tests, three clip-like wires were attached across each row of 3 pads and dip soldered. The 951 Green Tape™ parts were soldered at a temperature of 220° C.±5° C. for five seconds using 62/36/2 (Sn/Pb/Ag) solder. The parts made on lead free tape were soldered at 260° C.±5° C. using 95.5/3.8/0.7 (Sn/Ag/Cu) solder. After soldering, residual solder flux was cleaned from the soldered wire parts with Arcosolve. The parts were then divided into individual test samples for initial adhesion, thermal aged adhesion (150° C. soak) or thermal cycled adhesion (−40 to 125° C., 2 hour per cycle). A sample set consists of three to four parts for each test condition.

The parts are allowed to rest at room temperature for 16 hours after being soldered or after being removed from the relevant thermal chamber. For adhesion testing, the wire leads were bent to 90° in accord with the bending marks printed on each part and tensile strength was measured for each pad. The average of three (3) pads per part for three to four parts as measured was used as the adhesive strength of the thick film conductor applied to the substrate. This format was used for all adhesion testing—initial, thermal aged and thermal cycled.

Thermal Aged Adhesion

For this test, parts were placed in an oven at 150° C., and removed at approximately the following intervals (hours) for testing: 48, 100, 250, 500, 750, 1000.

Aged adhesion was measured according to the test method described above. For each test, the type of separation was noted, i.e., whether separation involved the wires pulling out of the solder, conductor pulling off the substrate, or cracking in the substrate. Any adhesion value above 12N was considered acceptable—any value below 10N was considered unacceptable.

Thermal Cycling and Thermal Cycling Adhesion

After soldering and cleaning, parts were placed in a thermal-cycle chamber which was then cycled between −40 and 125° C. every two hours. Parts were taken out for testing at different intervals (cycles). The nominal number of cycles chosen was 10, 30, 100, 250, and 500. The actual intervals chosen varied and the choice depended on the nature of the intermediate test results obtained.

The parts were examined under the microscope to check for any signs of cracking on tape or in solder before the wires were pulled for adhesion. After adhesion testing as described above, the failure mode combined with adhesion value was used to evaluate acceptability. If a tape fracture was combined with a very low adhesion value, it indicated that the tape underneath was cracked, even if cracks were not visually observed. If cracking was visually observed in the ceramic, the part was labeled as having failed this test. As before, failure without visual cracks was defined as adhesion below 12N.

Solder Wetting

The test pattern with no leads attached was immersed for 5 sec at 220° C. in solder. After solder application, the state of solder coverage was observed.

Measurement was carried out by the ratio of the pads to which solder had adhered completely, so that the conductor surface not visible to the total number of pads. In the case of this invention, 90% or above is considered good.

Example 10 is a control using a state of the current art Ag/Pd composition. This composition fails very early due to cracks in the ceramic during thermal cycling. This composition also exhibits marginal thermal cycled and aged adhesion.

Examples 1–4 show the effect of different titania concentrations over the claimed range. As the titania level is increased, thermal cycled adhesion improves. Thermal aged adhesion and solder wetting show a maximum value around 1.4% titania.

Example 5 shows the effect of adding both titania and antimony oxide to the composition. This addition shows an improvement in thermal cycled and thermal aged adhesion versus the control.

Examples 6–9 show the effect of adding both titania and cobalt oxide to the composition. This data shows that thermal cycled adhesion is dramatically improved over the control composition.

Example 10 shows the effect of using both titania and antimony oxide on lead free tape dielectric.

Conductors 1–10 were made using 74–75% Ag, 1.9–2.1% Pt dispersed in 20–22% organic vehicle and solvent.

| | $TiO_2$ | $Co_3O_4$ | $Sb_2O_3$ | # cycles | Thermal-cycled adhesion | Isothermal aged adhesion | Solderability % coverage |
|---|---|---|---|---|---|---|---|
| | Percent by weight | | | | Adhesion (N) | | |
| 1 | 1.4 | 0 | 0 | >500 | >12 | >12 | >90 |
| 2 | 1.6 | 0 | 0 | >500 | >12 | >12 | <90 |
| 3 | 1.1 | 0 | 0 | >500 | >12 | >12 | <90 |
| 4 | 0.6 | 0 | 0 | >500 | >12 | <12 | >90 |
| 5 | 0.8 | 0 | 0.5 | >500 | >12 | >12 | >90 |
| 6 | 0.6 | 0.1 | 0 | >500 | >12 | <12 | — |
| 7 | 0.6 | 0.3 | 0 | >500 | >12 | <12 | — |
| 8 | 0.8 | 0.1 | 0 | >500 | >12 | <12 | — |
| 9 | 0.1 | 0.6 | 0 | 400 | >12 | <12 | — |
| 10 | 0.7 | 0 | 0.7 | >500 | >12 | >12 | >90 |
| Control: commercial solderable Ag—Pd conductor | | | | 50 | <12 | >12 | >90 |

What is claimed is:

1. A thick film composition consisting of:
   a) electrically conductive powder;
   b) an inorganic binder wherein the inorganic binder is $TiO_2$ and a minor amount of one or more oxides selected from the group of oxides consisting of $CO_3O_4$, PbO, $Fe_2O_3$, $SnO_2$, $ZrO_2$, $Sb_2O_3$, $MnO_x$, $CuO_x$ and mixtures thereof, combined with said $TiO_2$ and
   c) an organic medium.

2. The composition of claim 1 wherein said electrically conductive powder is selected from gold, silver, platinum, palladium, and mixtures and alloys thereof.

3. The composition of claim 1 wherein the total inorganic binder is in the range of 0.5 wt. % to about 1.6 wt. % of the total composition.

4. The composition of claim 1 wherein said composition is compatible with low temperature co-fired ceramic tape.

5. A multilayer circuit formed by the method of claim 1.

6. A multilayer circuit utilizing the composition of claim 2.

7. The composition of claim 1 wherein said composition is applied to a dielectric green tape layer and wherein said thick film composition and dielectric green tape layer are thermally processed to produce a conductor layer and a fired dielectric tape layer wherein said conductor layer is capable of exceeding 500 cycles without cracking said dielectric tape layer and maintaining adhesion of said conductor to said fired dielectric tape layer.

* * * * *